(12) United States Patent
Yang et al.

(10) Patent No.: US 6,263,027 B1
(45) Date of Patent: Jul. 17, 2001

(54) MODULATOR AND PROCESS FOR MINIMIZING POWER CONSUMPTION AND COMMUNICATION SYSTEM EMPLOYING SAME

(75) Inventors: Ganning Yang, Irvine; Weizhuang Xin, Aliso Viejo, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/161,154

(22) Filed: Sep. 25, 1998

(51) Int. Cl.$^7$ ........................................................ H03C 3/00
(52) U.S. Cl. ............................ 375/302; 375/322; 370/20
(58) Field of Search ................................... 375/302, 277, 375/222, 322; 370/20; 380/49; 364/724.16

(56) References Cited

U.S. PATENT DOCUMENTS

| | | | |
|---|---|---|---|
| 4,907,218 | * 3/1990 | Inoue et al. | 370/20 |
| 5,648,923 | * 7/1997 | Lane et al. | 364/724.16 |
| 5,692,013 | * 11/1997 | Koslov et al. | 375/277 |
| 5,694,419 | * 12/1997 | Lawrence et al. | 375/222 |
| 5,838,797 | * 11/1998 | Iwasaki | 380/49 |

OTHER PUBLICATIONS

An Intermediate Frequency Modulator using Direct Digital Synthesis Techniques for Japanese Personal Handy Phone (PHP) and Digital European Cordless Telecommunications (DECT), Bjorn Bjerede, Joseph Lipowski, James Petranovich, Sheldon Gilbert; IEEE 4th Vehicular Technology Conference, 1994; pp. 467–471.

π/4–shift QPSK Digital Modulator LSIC for Personal Communication Terminals, Tetsu Sakata, Kazuhiko Seki, Shuji Kubota and Shuzo Kato; IEEE, International Symposium on Personal Indoor and Mobil Radio Communications (PIMRC), 1994, pp. 472–475.

* cited by examiner

Primary Examiner—Stephen Chin
Assistant Examiner—Tony Al-Beshrawi
(74) Attorney, Agent, or Firm—Foley & Lardner

(57) ABSTRACT

A modulator is configured with a first multiplexer having a first data signal input coupled to receive the first digital baseband signal and a second data signal input coupled to receive the second digital baseband signal. The first multiplexer provides a multiplexed output signal including components of the first and second digital baseband signals. The modulator also includes a source of alternating samples of first and second carrier signals and a multiplier having a first input coupled to the output of the first multiplexer and a second input coupled to the source of carrier signal samples. The multiplier is thereby coupled to provide a digital modulated output signal. The source of alternating samples of first and second baseband signals may include a second multiplexer having a first signal input coupled to receive a first carrier signal and a second signal input coupled to receive a second carrier signal. Alternatively, the source of alternating samples of first and second baseband signals may include a memory device for storing values associated with such samples and for providing access to such values in consecutive order of occurrence of the associated samples in the baseband signals.

21 Claims, 3 Drawing Sheets

MODULATOR AND PROCESS FOR MINIMIZING POWER CONSUMPTION AND COMMUNICATION SYSTEM EMPLOYING SAME

FIELD OF THE INVENTION

The present invention relates, generally, to digital modulator devices and communication systems and processes which use digital modulation, and, in particular embodiments, to such systems, processes and devices which minimize modulator size, and power requirements by minimizing the required number of multipliers.

DESCRIPTION OF THE RELATED ART

Electronic communication has become a part of many aspects of personal, business, military and other activities and tasks. As the popularity of various electronic communication devices increases, for example, personal communication devices such as cellular telephones, personal pagers, cordless telephones or the like, the demand for smaller, lighter, more power-efficient electronics increases.

Modulation of carrier signals with baseband signals is a function involved in many modern electronic communication systems. However, the hardware implementation of various conventional baseband modulators, at least for some popular system applications, requires significant die space and requires a significant amount of power.

Modulators are used in many modern electronic communication systems including, for example, devices that transmit signals over long distances, devices that transmit or store data represented as digital signals, and telecommunication devices. Transmitting devices typically modulate data signals to match their frequency characteristics to those of the transmission medium, for example, to minimize signal distortion, to use the available bandwidth efficiently, and to ensure that the signals have certain desirable properties. The process of modulation often involves modifying a high frequency signal, known as the carrier signal in sympathy with a data signal, called the modulating (or baseband) signal. For convenience, persons skilled in the art typically categorize modulation into one of two categories.

A first category, data modulation, involves encoding a stream of data (often referred to as a baseband signal) into a carrier signal. A carrier signal modified in accordance with a modulation scheme is referred to as a modulated carrier. Commonly used modulation schemes for the transmission of analog data over a bandpass channel (for example, a microwave, cellular telephone, or other radio frequency link) include, for example, Amplitude Modulation (AM), Frequency Modulation (FM), Single Sideband Modulation (SSB), etc. Commonly used modulation schemes for the transmission of digital data over a bandpass channel include, for example, Amplitude Shift Keying (ASK), Phase Shift Keying (PSK), Frequency Shift Keying (FSK), etc.

A second modulation category, up-conversion, involves shifting a signal from one frequency range to another (usually higher) frequency range. For example, in commercial broadcast applications, such as standard AM, FM or television broadcasts, a radio program (the baseband signal) is used to modulate a radio frequency carrier signal. The modulated radio frequency carrier signal is amplified and provided to a transmitting antenna for radiation as electromagnetic waves (radio waves). On the receiver end, a receiving antenna receives the electromagnetic waves, and demodulates and amplifies the signal to recover the original radio program.

In many popular applications, communication systems include portable or remote transmitting or receiving units that, in some instances, operate on limited power supplies, such as battery packs or the like, and/or are designed to be portable and stowable. For example, cellular telephone systems include cellular telephone transmitter/receiver units which, typically, operate on limited battery power and which are often designed to be carried in a compact space, such as a pocket, briefcase, purse or the like. Similarly, cordless telephone systems include cordless transmitter/receiver units which operate on a rechargeable battery and which are designed to be relatively light-weight and portable. It is typically desirable to minimize size, weight and power consumption requirements of such portable or remote units and components thereof. Of course, other communication systems would also benefit by minimizing size, weight and power consumption requirements.

However, modulation electronics required by some communication systems are often configured with components that have relatively high power requirements and take up considerable die space. For example, as described below with respect to FIG. 3 herein, modulation electronics used in, for example, transmitting devices of some conventional communications systems employ two multipliers and an adder which can contribute significantly to the overall power requirement, size and weight of the modulator circuit of the device. Thus, there is a need in the industry to minimize size (die space requirements), weight and power consumption requirements of modulation electronics in various communication systems.

SUMMARY OF THE DISCLOSURE

According, preferred embodiments of the present invention are directed to modulation electronics modulation circuits and communication devices and systems employing the same, as well as modulation and communication processes, which address the above-noted industry need, by employing a modulator configuration which employs components that require minimal die space, and power. Example modulator configurations described herein avoid the need for two multipliers and an adder.

A communication system according to an embodiment of the invention includes at least one transmitter and at least one receiver for communication on a communication channel. The transmitter includes a data signal source for providing first and second (for example, I and Q channel signals) digital baseband signals, an encoder for digitally encoding the first and second baseband signals, a wave shaper for smoothing the first and second baseband signals and a modulator coupled to the wave shaper, to provide a modulated output signal. For analog transmission embodiments, the transmitter further includes a digital-to-analog converter coupled to the multiplier output, for providing an analog modulated output signal. In wireless system embodiments, a power amplifier is coupled for amplifying the analog modulated signal and an antenna is coupled for transmitting the amplified analog modulated signal to the receiver.

A modulator according to a preferred embodiment, includes a first multiplexer having a first data signal input coupled to receive the first digital baseband signal and a second data signal input coupled to receive the second digital baseband signal from the wave shaper. The first multiplexer provides a multiplexed output signal including components of the first and second digital baseband signals. The modulator also includes a source of alternating samples of first and second carrier signals.

In one preferred embodiment, the source of alternating samples of first and second baseband signals includes a second multiplexer having a first signal input coupled to receive a first carrier signal and a second signal input coupled to receive a second carrier signal. The second multiplexer provides a multiplexed output signal including components of the first and second digital baseband signals. In another preferred embodiment, the source of alternating samples of first and second carrier signals includes an addressable memory device containing stored values corresponding to said samples of first and second carrier signals. In yet further preferred embodiments, the stored values are associated with consecutive addresses, in the order of occurrence of their corresponding samples of the baseband signals and a counter is provided for controlling access to said stored values in consecutive order of their associated addresses.

The modulator also includes a multiplier having a first input coupled to the output of the first multiplexer and a second input coupled to the source of carrier signal samples (i.e., the second multiplexer or the memory device). The multiplier is thereby coupled to provide a digital modulated output signal.

In this manner, the multiplier provides an output comprising a modulated signal which corresponds to the sum of the two multiplications carried out by a conventional modulator configuration having two multipliers and an adder. However, unlike the conventional configuration, preferred embodiments herein employ one multiplier and either one or two multiplexers. However, multiplexers can typically be implemented with relatively cost efficient, space efficient and power efficient electronics, as compared to a multiplier. Thus, preferred modulator configurations as described herein can provide significant improvements with respect to size (required die space), weight, power consumption and cost, with respect to conventional two-multiplier configurations.

DETAILED DESCRIPTION OF PREFERRED EMBODIMENTS

Embodiments of the present invention relate, generally, to communication systems and processes which use modulation, and modulator devices and processes.

Digital modulators and modulation processes according to embodiments of the present invention may be employed in a variety of communications electronics, including wireless transmission systems as well as wired systems. Thus, embodiments of the invention described herein may involve various forms of communications systems. However, for purposes of simplifying the present disclosure, preferred embodiments of the present invention are described herein, in relation to personal wireless communications systems, including, but not limited to digital cellular telephones, digital cordless telephones, digital pagers, combinations thereof, and the like. Such personal communications systems typically include one or more portable or remotely located receiver and/or transmitter units. In most applications, it is typically desirable to minimize the power requirements, size, weight and cost, of such receiver/transmitter units, for example, to improve portability and increase usage time between power recharges.

Figure 1:
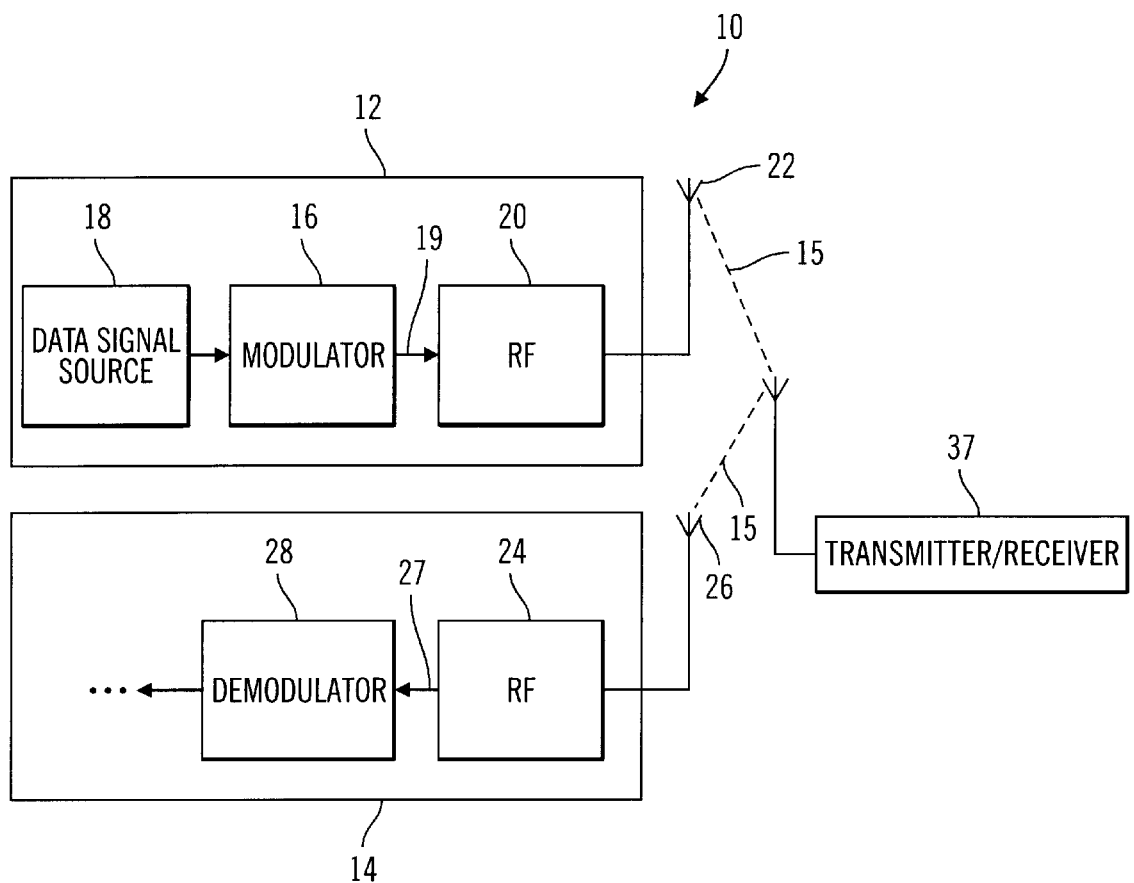
FIG. 1 is a block diagram representation of a system environment according to an example embodiment of the present invention.

A generalized block-diagram representation of a communication system environment of an embodiment of the present invention is shown in FIG. 1, wherein a communication system 10 includes a transmitting unit 12 and a receiving unit 14, coupled for communication over a communication channel 15. The transmitting unit 12 includes a modulator circuit 16 connected to receive a data signal (baseband signal) from a data signal source 18. In one representative embodiment, the data signal source may include, for example, a microphone for converting sound waves into electronic signals and sampling and analog-to-digital converter electronics for sampling and converting the electronic signals into digital signals representative of the sound waves. In other embodiments, the data source may include any suitable device for producing digital data signals for communication over the channel 15, such as, but not limited to, a keyboard, a digital voice encoder, a mouse or other user input device, a sensor, monitor or testing apparatus, or the like.

The modulator circuit 16 provides a modulated signal 19 as an output to an RF transmitter block 20. The transmitter block 20 includes appropriate RF transmitter components, such as filters, mixers, and power amplifiers, in accordance with well known principles of transmitter technology. The signal output of the transmitter 20 is provided for transmission from an antenna 22.

The receiving unit 14 includes an RF receiver block 24 connected to an antenna 26, to receive a modulated signal. The RF receiver block 24 includes appropriate receiver components for carrier signal down-converting and filtering to provide a filtered modulated signal 27, in accordance with well known principles of receiver technology. The filtered, modulated signal 27 is provided to a demodulator 28, for demodulation to produce the data signal (baseband) for further processing.

The demodulated (baseband) signal output from the demodulator 28 may be provided to signal processing electronics, sound producing electronics or the like, depending upon the nature of use of the communication system. The transmitter and receiver units include further components, power supplies, and the like, well known in the art for effecting transmission and reception of signals and for carrying out other functions specific to the nature and application of use of the system.

In preferred two-way communication system embodiments, such as cellular telephone embodiments or cordless telephone embodiments, each unit 12 and 14 is configured to function as both a transmitting unit and a receiving unit. In one system embodiment, the units 12 and 14 transmit and receive signals directly therebetween. In other system embodiments, the units 12 and 14 communicate through one or more additional transmitter/receiver configurations (such as repeater, base or cell stations), generally represented as reference character 30 in FIG. 1.

In digital cellular telephone or cordless telephone system embodiments, the data signal source 18 provides the modulator circuit 16 with a baseband signal, for example, a sampled, encoded voice (or sound) signal comprising I and Q channel signals. The I and Q channel signals may be provided, for example, in accordance with standard telephone technology, by converting a serial data stream of a sampled, encoded voice (or sound) signal into two parallel data streams (I and Q channel signals, respectively) with a serial-to-parallel converter. Such I and Q channel signals are provided to I and Q channel inputs of a modulator 16 as shown, for example, in FIG. 2. The modulator 16 in FIG. 2 includes an encoder 40, pulse shaping electronics 42 and frequency conversion and modulation electronics 44.

Baseband I and Q channel signals from a data signal source are provided to the I and Q inputs of the encoder 40. The I and Q outputs of the encoder are provided to the pulse shaping electronics 42. In one preferred cellular telephone embodiment, the encoder 40 comprises a Phase Shift Key encoder, such as, but not limited to, a π/4-shift Quadrature Phase Shift Key mapper with differential encoder (π/4 DQPSK), and the pulse shaping electronics comprises a pulse shaping filter for smoothing the encoder output signal. An example of a π/4 DQPSK and pulse shaping electronics is described in the article titled: "π/4-shift QPSK Digital Modulator LSIC for Personal Communication Terminals," by Tetsu Sakata, Kazuhiko Seki, Shuji Kubota and Shuzo Kato, IEEE, International Symposium on Personal Indoor and Mobile Radio Communications (PIMRC), 1994 (incorporated herein by reference). Other embodiments may employ other suitable encoding schemes, including but not limited to Amplitude Shift Keying and Frequency Shift Keying schemes.

The I and Q outputs of the pulse shaping electronics 42 are provided to the modulation electronics 44. In systems having analog transmission channels, the output of the modulator 16 may be converted to an analog signal and filtered for transmission.

Figure 2:
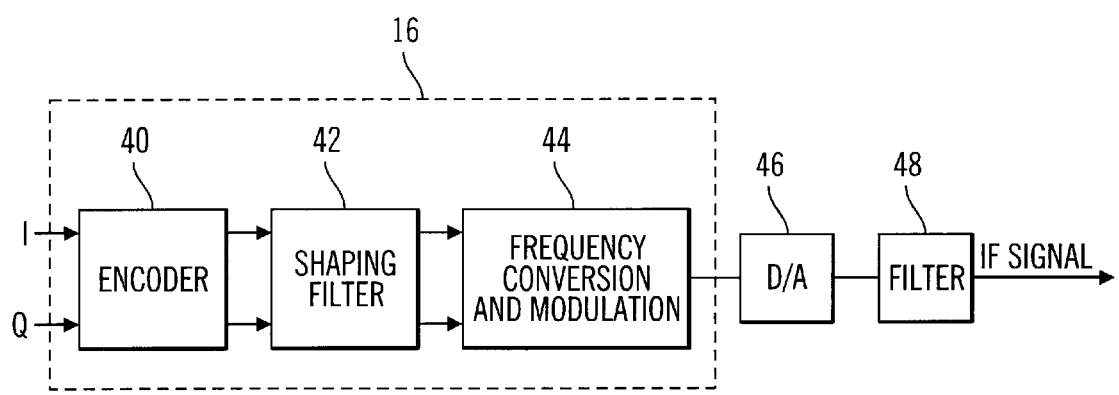
FIG. 2 is a more detailed block diagram representation of the modulator in the system of FIG. 1.

Accordingly, the output of a digital modulator 16 in FIG. 2 is provided to a digital-to-analog converter 46. The converter 46 provides an analog modulated signal to a lowpass or bandpass filter 48, which provides an output IF signal to an RF transmitter block 20 and antenna 22 (FIG. 1) for transmission.

Preferred embodiments of the present invention relate to modulation electronics 44, modulation circuits 16, and communication devices 12 and systems 10 employing the same, as well as modulation and communication processes. Such embodiments may be more clearly understood in view of the conventional modulation electronics briefly described with reference to FIG. 3. A common conventional configuration of digital modulation electronics is shown at 54 in FIG. 3.

Figure 3:
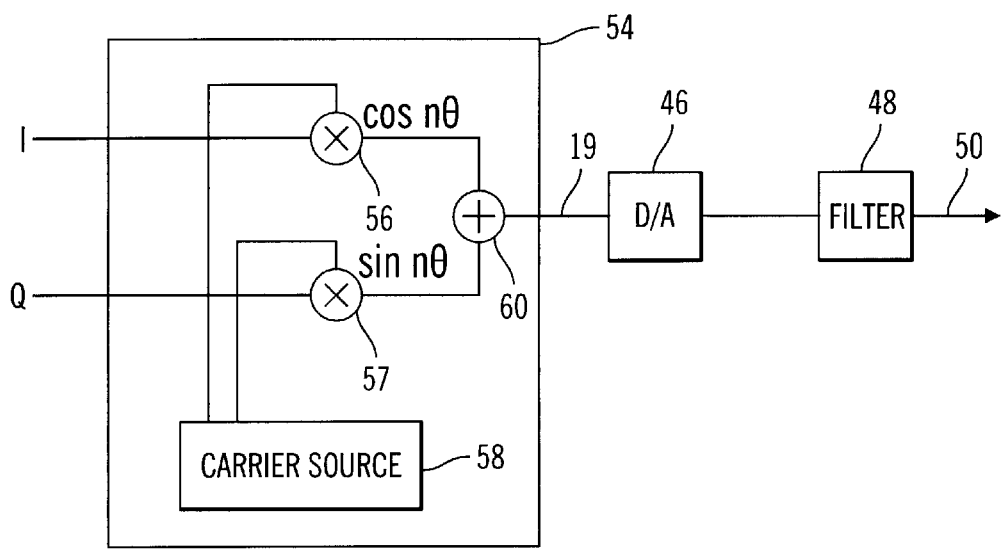
FIG. 3 is a block diagram representation of a conventional modulating electronic configuration.

The conventional modulation electronics configuration 54 of FIG. 3 employs two multipliers 56 and 57, one (multiplier 56) for multiplying a first digital carrier signal from a carrier source 58 with the I channel baseband signal from a pulse shaper, and the other (multiplier 57) for multiplying a second digital carrier signal with the Q baseband signal from a pulse shaper. In one preferred embodiment, the first digital carrier signal comprises a cos [nθ] signal and the second digital carrier signal comprises a sin [nθ] signal, which represent digital sampled versions of cos ωt and sin ωt signals, respectively, where ω=2πf$_c$, f$_c$ is the carrier frequency, t=nT, T is the sample duration (or period) of the baseband signal and n=0, 1, 2 . . . , such that, for example, cos ωt=cos [ω·nT]=cos [n·(ωT)]=cos [nθ], where θ=ωT.

An adder 60 sums the modulated I and Q channel signals to provide a resulting modulated signal 19. A configuration as shown in FIG. 3 is described in the above-cited IEEE article to Sakata et al. (and which has been incorporated herein by reference).

In certain limited applications of use, the sample frequency associated with the I and Q baseband signals may be associated with the frequency of the carrier signals, according to a relationship which may obviate the need for the multipliers in FIG. 3. For example, in contexts in which the data sample and carrier frequencies can be selected such that the carrier frequency f$_c$ is one-fourth of the data sample frequency f$_s$ (i.e.,f$_c$=¼f$_s$), a modulated signal 19 from the modulator shown in FIG. 3 will, effectively, comprise alternating samples of the I and Q channel signals, alternating between negative and positive values for each successive I-Q pair of samples making up the modulated signal. In such limited contexts, the modulated signal may be composed by, effectively, alternating between I and Q channel inputs and applying an appropriate negative or positive polarity to each I and Q channel sample, without the need for multipliers to multiplying carrier signals with baseband signals. However, in other contexts of use, the components of the system may be configured to operate according to a prescribed frequency plan which, due to other constraints of the system, may result in a relationship between the carrier and data sample frequencies wherein f$_c$≠¼f$_s$. In such contexts, an arrangement as shown in FIG. 3, employing two multipliers and an adder, have been employed.

Conventional modulator configurations, as shown in FIG. 3, which employ two multipliers, tend to be relatively large and, thus, require substantial die space, and can also be costly and have relatively large power requirements. However, for portable or personal communications systems, such as cellular telephone systems, cordless telephone systems, pager systems and the like, it is typically desirable to minimize size, cost and power consumption. Accordingly, a preferred embodiment of the present invention involves a modulation electronics configuration 44, which avoids the need for two multipliers and allows for minimization of size, cost and power usage, as compared to a two-multiplier arrangement such as described above with respect to FIG. 3.

Figure 4:
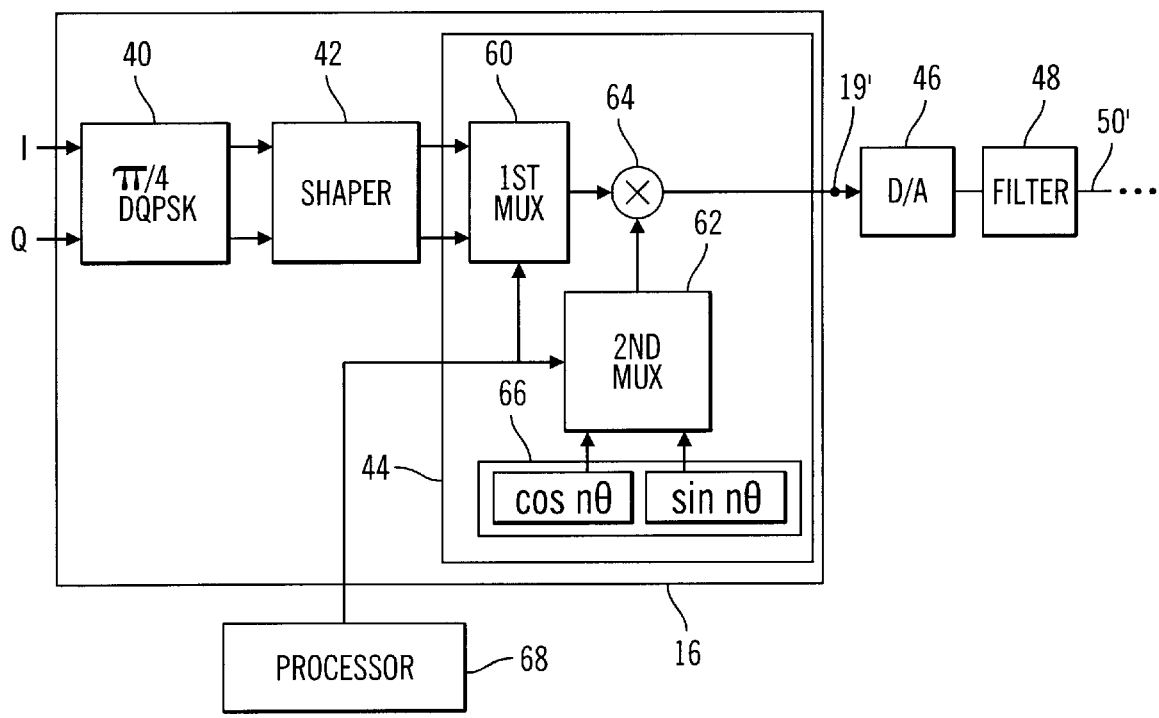
FIG. 4 is a more detailed block diagram representation of a modulator in the system of FIG. 1, including a more detailed block diagram representation of a modulating electronics configuration according to an embodiment of the present invention.

A block diagram representing principles of a modulation electronics configuration 44 according to a preferred embodiment of the present invention is shown in FIG. 4. The block diagram in FIG. 4 also shows modulation electronics 44 as a component of a modulation circuit 16 according to a modulation circuit embodiment of the present invention. Also, the block diagram of FIG. 4, in conjunction with the FIGS. 1 and 2, further shows the modulation circuit 16 (containing modulation electronics 44) as a component of a transmitter device 12 and a communications system 10, according to further embodiments of the present invention.

With reference to FIG. 4, the modulating electronics 44 includes first and second multiplexers 60 and 62 and a multiplier 64. The first multiplexer 60 has a pair of inputs coupled to the I and Q channel output of the pulse shaping electronics 42. The output of the first multiplexer 60 is coupled to an input of the multiplier 64. The other input of the multiplier 64 is coupled to the output of the second multiplexer 62.

The second multiplexer 62 has two inputs coupled to a carrier source 66 of two carrier signals such that, for example, one input of the multiplexer is coupled to the source 66 for a first carrier signal (such as a cos [nθ] signal) and the other input of the multiplexer is coupled to a source of a second carrier signal (such as a sin [nθ] signal). The source 66 may be similar, for example, to conventional carrier generators, such as shown at 58 in FIG. 3 and as described in the above-cited IEEE article to Sakata et al. (and which has been incorporated herein by reference). However, other suitable sources may be employed, as discussed with respect to further preferred embodiments below.

The multiplexers 60 and 62 each have switching control inputs for receiving a control signal from suitable control electronics, such as a processor. On board processors are typically included in modern portable transmitter devices for controlling various components of the transmitter and, in preferred embodiments of the present invention, such an on-board processor 68 is programmed (or otherwise configured) to also provide switching control signals to the multiplexers 60 and 62.

In operation, the multiplexer 60 is controlled by the processor 68 to switch between I and Q inputs and, thus, provide an output signal comprising alternating samples of the I and Q signals. At the same time, the second multiplexer 62 is similarly controlled to provide an output signal which alternates between first and second carrier signals (for example, cos [nθ] and sin [nθ] signals), to provide alternating samples of the first and second carrier signals. By controlling the multiplexers in synchronism, the output of the first multiplexer may be controlled to provide an I channel signal to the multiplier 64 when the second multiplexer provides a first carrier signal (for example, a cos [nθ] carrier signal) to the multiplier and to provide a Q channel signal to the multiplier 64 when the second multiplexer provides a second carrier signal (such as a sin [nθ] signal) to the multiplier.

Thus, for example, by representing the I and Q channel input signals for the multiplexer 60 as $I_0, I_1, I_2 \ldots I_n$, and $Q_0, Q_1, Q_2 \ldots Q_n$, respectively, the output of the multiplexer 60 can be represented as $I_0, Q_1, I_2, Q_3, I_4, Q_5 \ldots$ Similarly, by representing the carrier signal inputs to the multiplexer 62 as cos [nθ] and sin [nθ], respectively, the output of the multiplexer 62 can be represented as $\cos\theta_0, \sin\theta_1, \cos\theta_2, \sin\theta_3 \ldots$, where $\theta_n = n\theta$. The multiplier 64 performs a multiplication function on each combination of inputs from the multiplexers 60 and 64.

A modulated signal corresponding to the modulated signal 19 in FIGS. 1 and 3 may be obtained by converting the output of the multiplier 64 to an analog signal and passing the signal through a suitable bandpass filter. In one embodiment, the bandpass filter is selected to pass the fundamental frequency component of the multiplier output signal and filter out the harmonic frequency components. In another embodiment, the bandpass filter is selected to pass one or more selected harmonic frequency component(s) and filter out the fundamental frequency component and other harmonic frequency components. Thus, with a digital-toanalog (D/A) converter 46 and a bandpass filter 48 coupled to the output of the modulator 16 of FIG. 4, a modulated signal 50' (which corresponds to modulated signal 50 of FIG. 3) is obtained, for coupling to a transmission channel, for example, through a transmitter block 20 and antenna 22 as shown with respect to the modulated signal 19 in FIG. 1.

However, unlike the modulator configuration of FIG. 3, the configuration shown in FIG. 4 employs only one multiplier (multiplier 64). Other components included in the FIG. 4 configuration, such as the multiplexers 60 and 62, can typically be implemented with relatively cost efficient, space efficient and power efficient electronics, as compared to a multiplier. Thus, a configuration as described with respect to FIG. 4 can provide significant improvements with respect to size (required die space), weight, power consumption and cost, with respect to a configuration as described above with respect to FIG. 3.

In preferred embodiments, the change rate at which the multiplexers 60 and 62 are controlled is selected, based on the desired frequency of the IF output signal and the sampled rate of the input baseband signals. Thus, for example, in a typical cellular telephone context, wherein the desired IF signal frequency (after conversion and filtering by the D/A converter and the filter 46 and 48) is, for example, 10.75 MHz, and the sampling rate of the baseband I and Q signals from the shaper are 1.92 MHz, a change rate of 9.6 MHz sampling rate of 9.6 MHz for the D/A converter may be employed. Therefore, the frequency conversion and modulation 44 (FIG. 4) should provide:

10.75 MHz–9.6 MHz=1.15 MHz modulated carrier signal.

The carrier frequency conversion principle can be found in the paper "An Intermediate Frequency Modulator using Direct Digital Synthesis Techniques for Japanese Personal Handy Phone (PHP) and Digital European Cordless Telecommunications (DECT)" by Bjorn Bjerede, Joseph Lipowski, James Petranovich, Sheldon Gilbert, IEEE 44th Vehicular Technology Conference, 1994.

In that example, consider a context in which the data rate for the I and Q baseband signals from a data signal source is 384 kHz, such as in a personal handy phone (PHS) system. The data rate of the I and Q baseband signals may first be divided by ½ to provide 192 kHz I and Q baseband signals to the encoder 40, which then provides a 192 kHz encoded signal to the shaper 42. The shaper 42 may comprise a shaping filter selected to have an oversampling rate of 10, to provide 1.92 Mhz output I and Q signals. In one preferred embodiment, a sampled rate converter is provided between the shaper 42 and the first multiplexer 60 (preferably as part of the modulator electronics 44) for converting the sampling rate (for example, by increasing the rate by a factor corresponding to the sample rate of the D/A converter 46, which is selected based upon the desired frequency of the IF signal. In the above example, by increasing the sampling rate by a factor of 5, the resulting I and Q signal output rate will be 5×1.92 MHz=9.6 MHz.

In a preferred embodiment, the rate converter comprises a repeater device which has a repeating rate N, such that it repeats each baseband signal value a number N times before the next baseband signal value. Thus, using the above example, wherein the rate converter increases the sampling rate by a factor of 5, the repeating rate N may be set to 5, to provide a signal with the sampling rate of 4.6 MHz.

In the embodiment illustrated in FIG. 4, the carrier source 66 is shown as a component of the modulating electronics 44. The carrier source may comprise, for example, a digital wave-form generator, a memory device (for example, but not limited to a ROM) which stores data corresponding to a digital wave-form, or other suitable carrier source means. In further embodiments, the carrier source is provided external to the modulating electronics 44 and is electrically coupled to the modulating electronics 44.

As described above, the modulating electronics 44 in FIG. 4 is provided as a component of a modulator circuit 16, according to an embodiment of the present invention. In the FIG. 4 embodiment, the modulator circuit 16 further includes an encoder 40 and pulse shaping electronics 42. The encoder 40 in FIG. 4 is a π/4 DQPSK, as described above. However, other embodiments may employ other suitable encoders, depending upon encoding scheme adopted for the transmission channel and operational environment of the system.

In a preferred embodiment, the modulator circuit 16, including components shown within the box representing the modulator circuit 16 in FIG. 4, comprises a single integrated circuit chip made, for example, according to well known Large Scale Integration LSI techniques. In other embodiments, the encoder 40 and/or the pulse shaper 42 may be located external to the modulator circuit chip and connected thereto by suitable electronic couplings. In yet further embodiments, other components, such as the converter 46 and/or the filter 20 may also be provided on the same integrated circuit chip as the modulating electronics 44.

Figure 5:
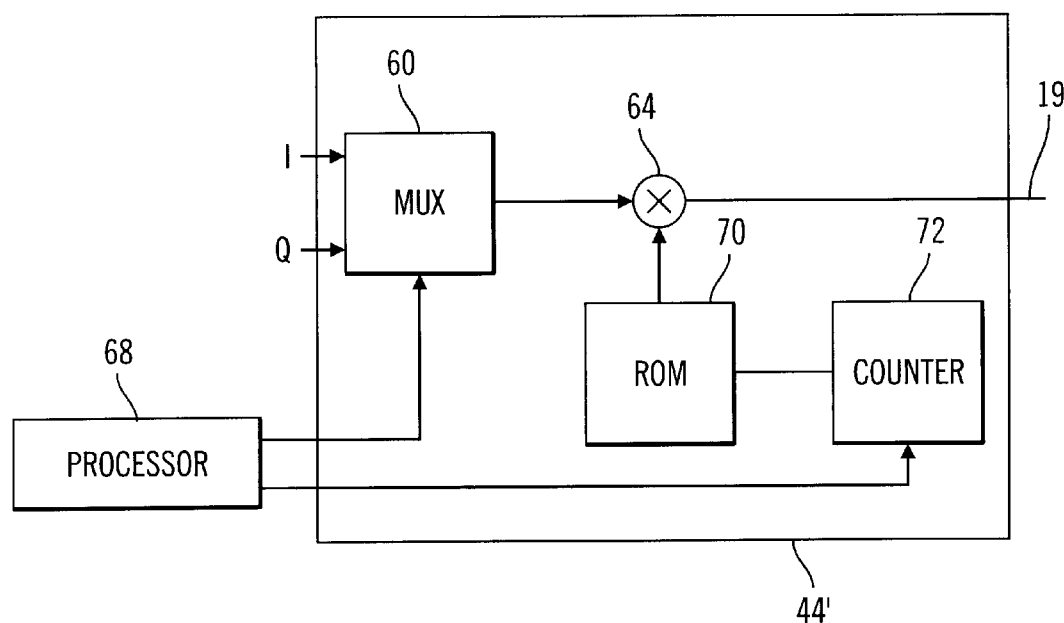
FIG. 5 is a more detailed block diagram representation of a modulating electronics configuration according to a further embodiment of the present invention.

A further preferred embodiment of the modulating electronics 44' is shown in FIG. 5, wherein the second multiplexer 62 is replaced with a further embodiment of a source of alternating samples of first and second carrier signals. In the FIG. 5 embodiment, the second multiplexer is replaced with a memory device 70 (for example, a ROM) and a controller 72 (for example, a counter). The memory device 70 stores discrete carrier wave-form values. In preferred embodiments, the memory device 70 is an addressable memory, storing a table or list of discrete carrier wave-form values. The controller 72 controls the output of (or access to) stored values in synchronism with the output rate of the multiplexer 60. In the illustrated example, the controller is coupled to receive control signals from the processor 68 to effect such synchronization.

The list or table of values stored in the memory device 70 is preferably arranged (or accessed) to provide the wave-form values in the their consecutive order of occurrence in first and second carrier signals and alternating between first and second carrier signal values. This can be effected, for example, by associated consecutive addresses of the addressable memory device to carrier wave-form values in the order of occurrence in the carrier signals of the carrier signal samples that correspond to the stored values. Thus, for example, with the cos [nθ] and sin [nθ] carrier signals noted above (where $\theta_n = n\theta$), the list or table of values is arranged (or at least accessed from the memory device) to provide an input to the multiplier 64 in an alternating, consecutive order, such as the top-down order shown in Table 1 below:

TABLE 1

| $\cos(\theta_0)$ |
|---|
| $\sin(\theta_1)$ |
| $\cos(\theta_2)$ |
| $\sin(\theta_3)$ |
| . |
| . |
| . |
| $\cos(\theta_{2k})$ |
| $\sin(\theta_{2k+1})$ |

Accordingly, the second input of the multiplier 64 in the FIG. 5 embodiment is provided stored values from the memory device 70, corresponding to consecutive and alternating values of the first and second carrier wave-forms, which simulates the output of the second multiplexer 62 of the FIG. 4 embodiment. However, unlike the embodiment shown in FIG. 4, the embodiment of FIG. 5 employs only one multiplexer 60 and one composite carrier generator. In further embodiments, die space may be further conserved by locating the memory device 70 and/or the controller 72 external to the modulating electronics 44' or external to the modulator circuit 16. Thus, the size, weight, cost and power requirements of the modulating electronics may be further minimized. In yet further embodiments, additional efficiencies may be obtained by implementing the ROM in combinational logic circuitry.

Accordingly, preferred communication system, modulator and modulation process embodiments described herein can provide significant benefits with respect to minimization of die space requirements, cost and power usage. While such benefits are primarily described herein with respect to personal communication systems, such as cellular telephone or cordless telephone systems which include small, portable transmitter and/or receiver units, it will be readily apparent to those skilled in the art that aspects of the present invention may be applied to other communication systems, including those employing wired, wireless, optical or hybrid channels.

What is claimed is:

1. A digital modulator device for receiving first and second digital baseband signals and providing a digital modulated output signal, the modulator comprising:
   a first multiplexer having a first data signal input coupled to receive the first digital baseband signal and a second data signal input coupled to receive the second digital baseband signal, the first multiplexer having an output to provide a multiplexed output signal including components of the first and second digital baseband signals;
   a source of alternating samples of first and second carrier signals;
   a multiplier having a first input coupled to the output of the first multiplexer and a second input coupled to the source of carrier signal samples, the multiplier having an output to provide a digital modulated output signal.

2. A digital modulator as recited in claim 1, wherein said source of alternating samples of first and second carrier signals comprises a second multiplexer having a first signal input coupled to receive a first carrier signal and a second signal input coupled to receive a second carrier signal, the second multiplexer having an output to provide a multiplexed output signal including components of the first and second digital baseband signals.

3. A digital modulator as recited in claim 1, wherein said source of alternating samples of first and second carrier signals comprises a memory device containing stored values representative of said samples of first and second carrier signals.

4. A digital modulator as recited in claim 1, wherein said source of alternating samples of first and second carrier signals comprises:
   an addressable memory device containing stored values corresponding to said samples of first and second carrier signals, said values being associated with consecutive addresses, in the order of occurrence of their corresponding samples of the baseband signals; and
   a counter for controlling access to said stored values in consecutive order of their associated addresses.

5. A digital modulator as recited in claim 1, further comprising a carrier signal source comprising means for providing the first carrier signal and means for providing the second carrier signal.

6. A digital modulator as recited in claim 5, wherein said means for providing the first carrier signal comprises means for providing a cosine signal, while said means for providing the second carrier signal comprises means for providing a sine signal.

7. A digital modulator as recited in claim 1, further comprising a memory device for storing the first and second carrier signals and wherein the second multiplexer is coupled to access the stored carrier signals.

8. A digital modulator for receiving first and second baseband signals and providing a modulated output signal, the modulator comprising:

an encoder for receiving the first and second baseband signals and providing first and second digitally encoded baseband signals;

a pulse shaper for receiving the first and second digitally encoded baseband signals and providing first and second shaped baseband signals;

a first multiplexer having a first data signal input coupled to receive the first shaped baseband signal and a second data signal input coupled to receive the second shaped baseband signal, the first multiplexer having an output to provide a multiplexed output signal including components of the first and second digital baseband signals;

a source of alternating samples of first and second carrier signals;

a multiplier having a first input coupled to the output of the first multiplexer and a second input coupled to the output of the second multiplexer, the multiplier having an output to provide a digital modulated output signal.

9. A modulator as recited in claim 8, wherein said source of alternating carrier signal samples comprises a second multiplexer having a first signal input coupled to receive a first carrier signal and a second signal input coupled to receive a second carrier signal, the second multiplexer having an output to provide a multiplexed output signal including components of the first and second digital baseband signals.

10. A digital modulator as recited in claim 8, wherein said source of alternating samples of first and second carrier signals comprises a memory device containing stored values representative of said samples of first and second carrier signals.

11. A digital modulator as recited in claim 8, wherein said source of alternating samples of first and second carrier signals comprises:

an addressable memory device containing stored values corresponding to said samples of first and second carrier signals, said values being associated with consecutive addresses, in the order of occurrence of their corresponding samples of the baseband signals; and a counter for controlling access to said stored values in consecutive order of their associated addresses.

12. A modulator as recited in claim 8, further comprising a carrier signal source for providing the first and second carrier signals.

13. A modulator device as recited in claim 8, further comprising a memory device for storing the first and second carrier signals and wherein the second multiplexer is coupled to access the stored carrier signals.

14. In a communication system comprising at least one transmitter and at least one receiver for communication on a communication channel, the transmitter comprising:

a data signal source for providing first and second digital baseband signals;

an encoder for receiving the first and second baseband signals and providing first and second digitally encoded baseband signals;

a pulse shaper for receiving the first and second digitally encoded baseband signals and providing first and second shaped baseband signals;

a first multiplexer having a first data signal input coupled to receive the first digital baseband signal and a second data signal input coupled to receive the second digital baseband signal, the first multiplexer having an output to provide a multiplexed output signal including components of the first and second digital baseband signals;

a source of alternating samples of first and second carrier signals;

a multiplier having a first input coupled to the output of the first multiplexer and a second input coupled to the source of carrier signal samples, the multiplier having an output to provide a digital modulated output signal.

15. A system as recited in claim 14, further comprising:

a digital-to-analog converter coupled to the multiplier output, for providing an analog modulated output signal;

a power amplifier for amplifying the analog modulated signal; and an antenna coupled to the power amplifier, for transmitting the analog modulated signal to the receiver.

16. A system as recited in claim 14, wherein said source of alternating samples of first and second carrier signals comprises a second multiplexer having a first signal input coupled to receive a first carrier signal and a second signal input coupled to receive a second carrier signal, the second multiplexer having an output to provide a multiplexed output signal including components of the first and second digital baseband signals.

17. A digital modulator as recited in claim 14, wherein said source of alternating samples of first and second carrier signals comprises a memory device containing stored values representative of said samples of first and second carrier signals.

18. A digital modulator as recited in claim 14, wherein said source of alternating samples of first and second carrier signals comprises:

an addressable memory device containing stored values corresponding to said samples of first and second carrier signals, said values being associated with consecutive addresses, in the order of occurrence of their corresponding samples of the baseband signals; and a counter for controlling access to said stored values in consecutive order of their associated addresses.

19. A process of providing a modulated signal for a communication system, the process comprising:

providing first and second digital baseband signals;

encoding the first and second baseband signals to provide first and second digitally encoded baseband signals;

multiplexing the first and second digitally encoded baseband signals to provide a multiplexed baseband signal;

providing alternating samples of first and second carrier signals;

multiplying the multiplexed baseband signal by the alternating samples of first and second carrier signals with a digital signal multiplier to provide a digital modulated output signal.

20. A process as recited in claim 19, wherein said alternating samples of first and second carrier signals are provided by:

providing first and second digital carrier signals;

multiplexing the first and second digital carrier signals to provide a multiplexed carrier signal.

21. A process as recited in claim 19, wherein said alternating samples of first and second carrier signals are provided by:

storing values representative of said samples of first and second carrier signals; and retrieving stored values in consecutive order of occurrence of their corresponding carrier signal samples.

* * * * *